(12) United States Patent
Chen et al.

(10) Patent No.: US 10,084,133 B2
(45) Date of Patent: Sep. 25, 2018

(54) MASK

(71) Applicant: Au Optronics Corporation, Hsinchu (TW)

(72) Inventors: Jui-Hsiang Chen, New Taipei (TW);
Hsin-Hung Chen, New Taipei (TW);
Po-Wen Teng, Taoyuan (TW);
Chun-Chih Lai, New Taipei (TW);
Nan-Huei Jiang, Taoyuan (TW);
Han-Chung Lai, Taoyuan (TW)

(73) Assignee: Au Optronics Corporation, Hsinchu (TW)

( * ) Notice: Subject to any disclaimer, the term of this patent is extended or adjusted under 35 U.S.C. 154(b) by 53 days.

(21) Appl. No.: 15/011,444

(22) Filed: Jan. 29, 2016

(65) Prior Publication Data

US 2016/0322572 A1    Nov. 3, 2016

(30) Foreign Application Priority Data

Apr. 28, 2015    (TW) .............................. 104113517 A (51) Int. Cl.
*H01L 51/00* (2006.01)
*B05C 21/00* (2006.01)
*C23C 14/04* (2006.01)

(52) U.S. Cl.
CPC ........ *H01L 51/0011* (2013.01); *B05C 21/005* (2013.01); *C23C 14/042* (2013.01)

(58) Field of Classification Search
None
See application file for complete search history.

(56) References Cited

U.S. PATENT DOCUMENTS

| 5,742,129 A | 4/1998 | Nagayama et al. |
| 9,362,501 B2 | 6/2016 | Hsu et al. |
| 2004/0232109 A1* | 11/2004 | Yoshinaga ............ C23C 14/042 216/54 |
| 2011/0229633 A1* | 9/2011 | Hong ................... H01L 51/0011 427/162 |
| 2015/0013600 A1 | 1/2015 | Hsu et al. |
| 2016/0011504 A1 | 1/2016 | Wu |

FOREIGN PATENT DOCUMENTS

| CN | 103236398 | 8/2013 |
| CN | 103572205 | 2/2014 |

* cited by examiner

*Primary Examiner* — Jethro M. Pence
(74) *Attorney, Agent, or Firm* — JCIPRNET (57) ABSTRACT

A mask including patterned structures arranged sequentially along a predetermined direction and a peripheral area surrounding the patterned structures is provided. Each of the patterned structures includes an opening portion and a thinning portion surrounding the opening portion. The opening portion has through holes arranged in a matrix. An outline of the thinning portion has two side edges opposite to each other substantially parallel to the predetermined direction. The thinning portion is defined by an area demarked by the outline of the thinning portion and an outline of the opening portion. A thickness of the thinning portion is thinner than a thickness of the peripheral area.

10 Claims, 12 Drawing Sheets

MASK

CROSS-REFERENCE TO RELATED APPLICATION

This application claims the priority benefit of Taiwan application serial no. 104113517, filed on Apr. 28, 2015. The entirety of the above-mentioned patent application is hereby incorporated by reference herein and made a part of this specification.

BACKGROUND OF THE INVENTION

Field of the Invention

The invention relates to a mask, and more particularly, to a mask used for an evaporation process.

Description of Related Art

The organic light emitting device (OLED) has tremendous application potential to become the mainstream of the next generation flat panel display due to its advantages of self-luminescence, wide viewing angle, low power consumption, simple manufacturing process, low cost, low working temperature, high response speed, full-color display, and so forth. Generally, the method of fabricating the organic light emitting device lies in using evaporation process to form an organic material layer on the substrate, and a mask can be disposed between the substrate and the evaporation source during the evaporation process to fabricate a deposited layer that is patterned.

A fine metal mask (FMM) used for evaporation is constructed by etching a sheet metal to form micro opening therein, and the micro openings in the sheet metal after the etching are the evaporation openings which allows the evaporation materials to pass through and be deposited on the substrate. No gap shall exist between the metal mask and the substrate used for deposition during the evaporation process, so as to avoid the spillover of the evaporation material which creates shadow effect. Therefore, the evaporation process not only needs the fastening mechanism in the machine for fixing the metal mask but also needs a magnetic board disposed on the substrate, so that metal mask sticks closely to the substrate because of the magnetic force of attraction.

When the fastening mechanism fixes the metal mask, two ends of the metal mask are clamped, so as to support and to spread the metal mask. Under this condition, the metal mask undergoes the stress with a non-uniform distribution because of the metal mask pattern design (such as design about distribution of evaporation openings). When the metal mask undergoes the stress with the non-uniform distribution, the metal mask can have wrinkles and can not be able to flatly stick to the substrate. Therefore, the evaporation process needs decreasing the probability of generating wrinkles on the metal mask.

SUMMARY OF THE INVENTION

The invention provides a mask which is not easy to generate wrinkles when using for an evaporation process.

A mask of the invention includes a plurality of patterned structures and a peripheral area. The patterned structures are arranged sequentially along a predetermined direction. Each of the patterned structures includes an opening portion and a thinning portion. The opening portion has through holes arranged in a matrix. The thinning portion surrounds the opening portion. An outline of the thinning portion has two side edges opposite to each other and substantially parallel to the predetermined direction, and the thinning portion is defined by an area demarked by the outline of the thinning portion and an outline of the opening portion. The peripheral area surrounds the patterned structures, and the thickness of the thinning portion is thinner than the thickness of the peripheral area.

Based on the above, the mask according to the embodiments of the invention has a plurality of patterned structures, and each of the patterned structures has the opening portion and the thinning portion configured inside-out, the thickness of the thinning portion is configured to buffer and to disperse the tensile stress, so as to mitigate the phenomenon of generating uneven wrinkles when the mask is extended by external forces.

In order to make the aforementioned and other features and advantages of the invention more comprehensible, embodiments accompanying figures are described in detail belows.

DESCRIPTION OF THE EMBODIMENTS

Figure 1:
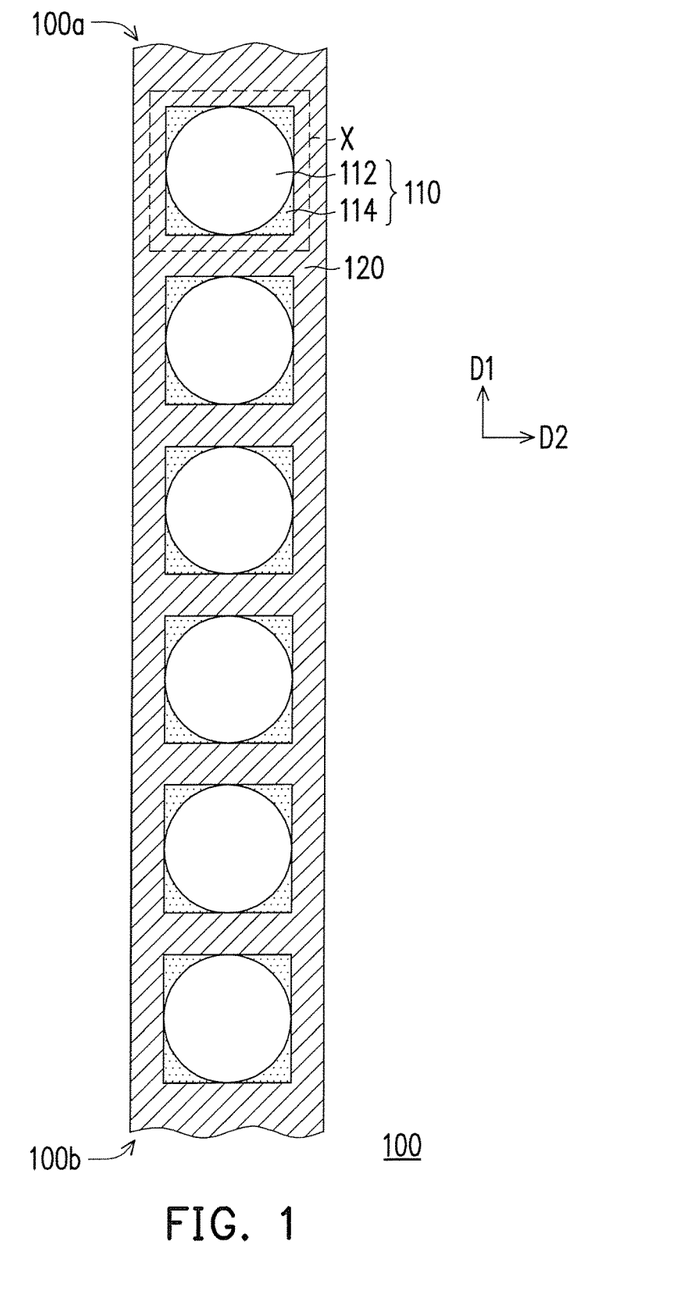
FIG. 1 is a schematic top view of a part of a mask of one embodiment of the invention.
Figure 2:
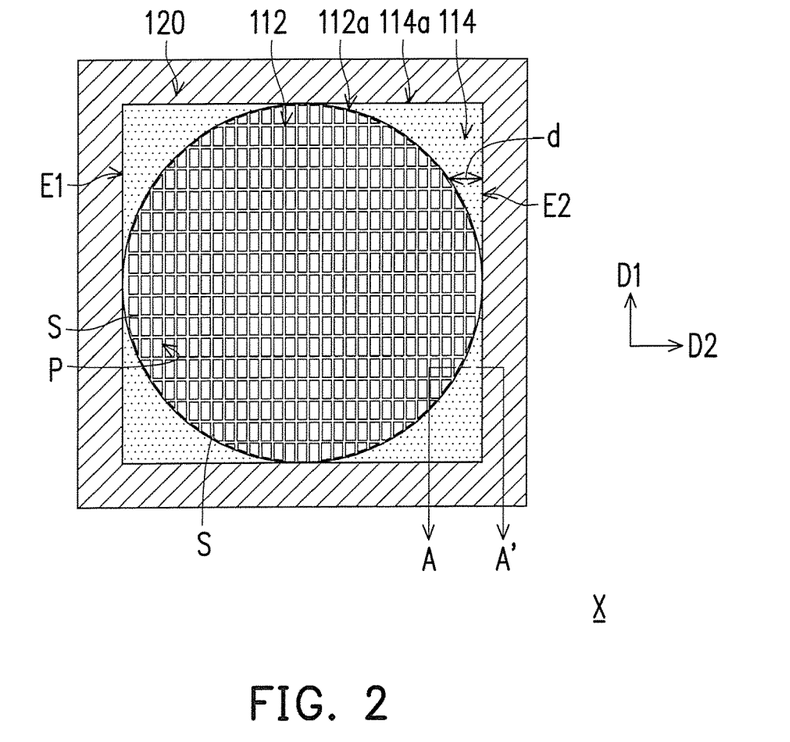
FIG. 2 is an enlarged schematic view of an area X of FIG. 1.

FIG. 1 is a schematic top view of a part of a mask of one embodiment of the invention. FIG. 2 is an enlarged schematic view of an area X of FIG. 1. Referring to FIG. 1 and FIG. 2, a mask 100 includes a plurality of patterned structures 110 and a peripheral area 120. The plurality of patterned structures 110 are arranged sequentially along a predetermined direction D1. Each of the patterned structures 110 includes an opening portion 112 and a thinning portion 114. The opening portion 112 has through holes P (depicted in FIG. 2) arranged in a matrix. The thinning portion 114 surrounds the opening portion 112. An outline 114a of the thinning portion 114 has two side edges E1 and E2 opposite to each other and substantially parallel to the predetermined direction D1. The thinning portion 114 is defined by an area demarked by the outline 114a of the thinning portion 114 and an outline 112a of the opening portion 112. The peripheral area 120 surrounds the patterned structures 110.

In the present embodiment, the mask 100 can be a mask having a narrow and long shape, and the extending direction of the mask 100 is parallel to the predetermined direction D1. When the mask 100 is applied in the evaporation process, the mask 100 is fastened and spread by the fastening mechanism of the machine. Herein, the fastening mechanism of the machine clamps the two ends 100a and 100b of the mask 100, so as to flatten the mask 100. Under this condition, the mask 100 undergoes the tensile stress which is mostly parallel to the predetermined direction D1. It is noted that, regarding the tensile stress, the non-uniform stress distribution problem is not easily caused at the peripheral edges of each patterned structure 110 (the outline 114a of the thinning portion 114) through the design that the thinning portion 114 has two side edges E1 and E2 substantially parallel to the predetermined direction D1, so as to decrease the probability of generating wrinkles on the mask 100 and/or to decrease the undulation degree of the wrinkles of the mask 100.

Figure 3:
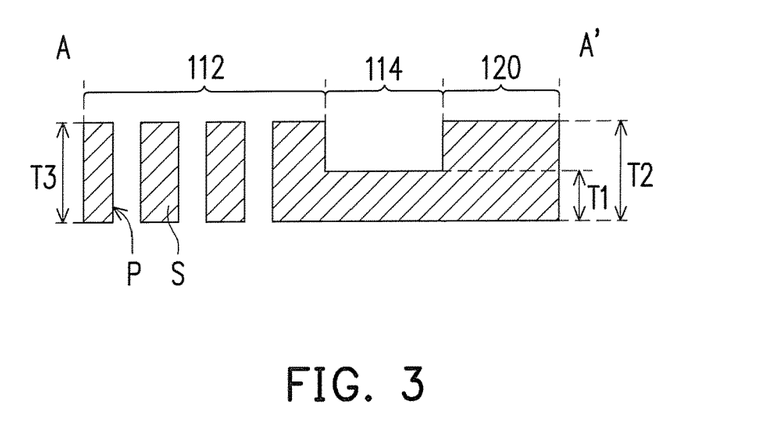
FIG. 3 is a schematic cross-sectional view of a part of a mask according to one embodiment of the invention.

FIG. 3 is a schematic cross-sectional view of a part of a mask of one embodiment of the invention. Specifically, FIG. 3 is corresponding to the cross-section line A-A' in FIG. 2. Referring to FIG. 2 and FIG. 3, the thickness T1 of the thinning portion 114 is thinner than the thickness T2 of the peripheral area 120. The opening portion 112 includes a plurality of thin line sections S. The thin line sections S are connected to form a grid and define the through holes P. In the present embodiment, the thickness T3 of the thin line sections S is thicker than the thickness T1 of the thinning portion 114. The thickness T3 of the thin line sections S can be equal to the thickness T2 of the peripheral area 120. To be more specific, the thickness T1 of the thinning portion 114 is in range of 35% to 75% of the thickness T2 of the peripheral area 120. However, the invention is not limited thereto, in other embodiments, the thickness T1 of the thinning portion 114, the thickness T2 of the peripheral area 120, and the thickness T3 of the thin line sections S can have other appropriate designs. Regardless of the comparison between the thickness T1 of the thinning portion 114 and the thickness T2 of the peripheral area 120 or the relation between the thickness T3 of the thin line section S and the thickness T2 of the peripheral area 120, the features that small thickness T1 of the thinning portion 114 and large thickness T2 of the peripheral area 120 of the mask 100 are all within the scope of the invention.

Referring to FIG. 1, FIG. 2, and FIG. 3, the mask 100 of the present embodiment is the same thin sheet. In other words, the patterned structures 110 and the peripheral area 120 are formed by patterning a same thin sheet. For example, the first and the second patterned photoresist are formed on the top and bottom surfaces of the thin sheet respectively. To be more specific, the first and the second patterned photoresists all expose the predetermined areas of the through holes P. The first patterned photoresist exposes the predetermined area of the thinning portion 114, but the second patterned photoresist covers the predetermined area of the thinning portion 114. Therefore, the first and the second patterned photoresists function as a patterned mask, so as to form the through holes P which penetrate through the thin sheet and the thinning portion 114 which does not penetrate through the thin sheet. However, the invention is not limited thereto, in other embodiments, other appropriate methods to form the mask 100 are also applicable. In the present embodiment, the mask 100 can be fabricated by a metal thin sheet, but the invention is not limited thereto. In other embodiments, the mask 100 can be fabricated by other appropriate materials.

Referring to FIG. 2, in the present embodiment, the outline 112a of the opening portion 112 forms a non-rectangular shape, such as a circular shape. The outline 114a of the thinning portion 114 forms a rectangular shape. The outline 112a of the opening portion 112 can be internally tangent with the outline 114a of the thinning portion 114, but the invention is not limited thereto. A distance d between the outline 112a of the opening portion 112 and the outline 114a of the thinning portion 114 decreases gradually at first and then increases gradually along the predetermined direction D1. It should be noted that, the shape of the outline 112a of the opening portion 112 is not limited to the circular shape in the invention. In other embodiments, the outline 112a of the opening portion 112 can be designed with different shapes, depending on the actual requirements (for example, the mask 100 is used to fabricate the appearance of the organic electroluminescence display). In addition, the invention does not limit that the outline 112a of the opening portion 112 must be internally tangent with the outline 114a of the thinning portion 114. In other embodiments, the shortest distance between the outline of the opening portion and the outline of the thinning portion can not be equal to zero. The other embodiments and corresponding Figures are described as following.

Figure 4:
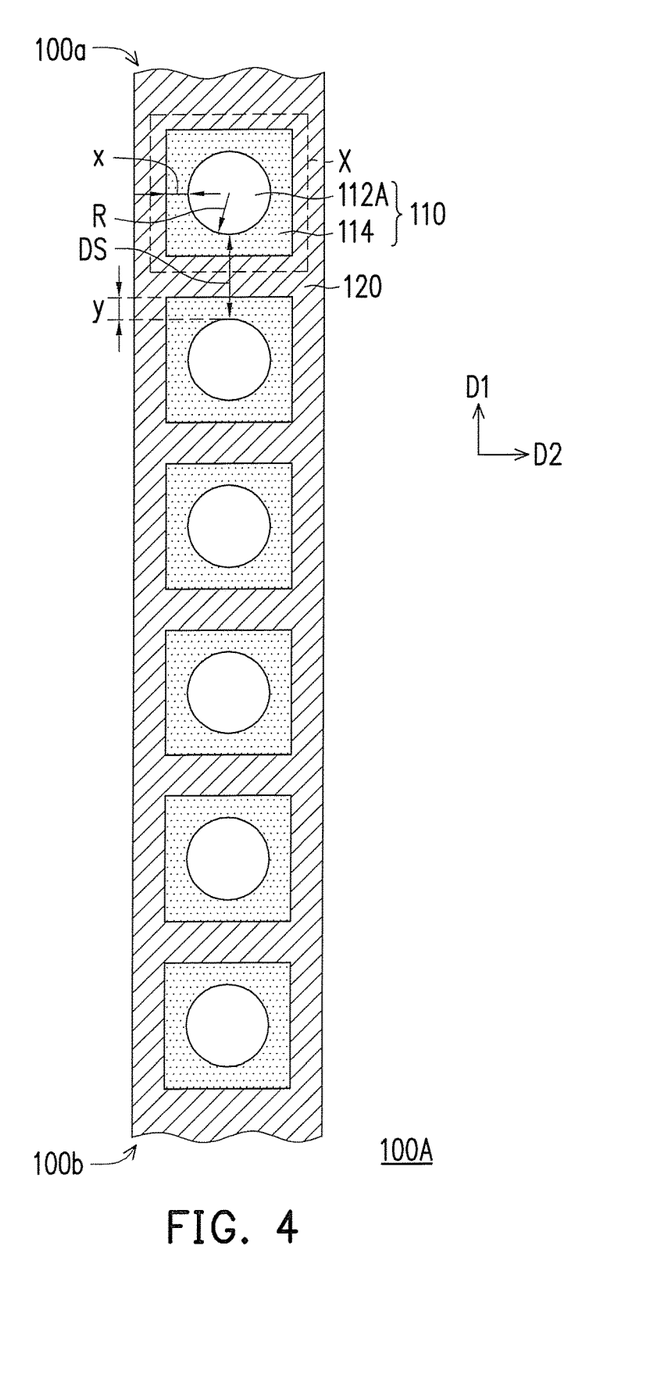
FIG. 4 is a schematic top view of a part of a mask according to another embodiment of the invention.
Figure 5:
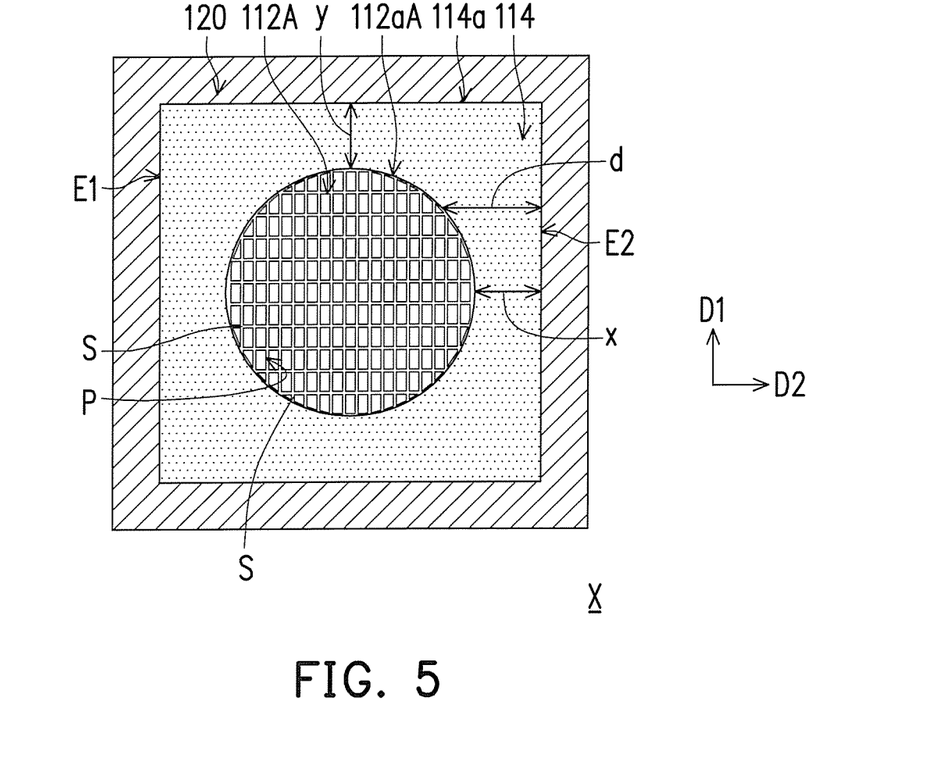
FIG. 5 is an enlarged schematic view of an area X of FIG. 4.

FIG. 4 is a schematic top view of a part of a mask of another embodiment of the invention. FIG. 5 is an enlarged schematic view of an area X of FIG. 4. Referring to FIG. 1, FIG. 2, FIG. 4, and FIG. 5, the mask 100A is similar to the mask 100, and thus the same or corresponding elements are represented by the same or corresponding reference labels. The difference between the mask 100A and the mask 100 is that the outline 112a of the opening portion 112 is not internally tangent with the outline 114a of the thinning portion 114. The following descriptions mainly lies in this difference, and the descriptions of other elements in FIG. 4 and FIG. 5 with the same reference labels mentioned in the above are referred to the above embodiments and will not be repeated.

Referring to FIG. 4 and FIG. 5, the mask 100A includes a plurality of patterned structures 110 arranged sequentially along the predetermined direction D1 and the peripheral area 120 surrounding the patterned structures 110. Each of the patterned structures 110 includes the opening portion 112A and the thinning portion 114 surrounding the opening portion 112A. The opening portion 112A has the through holes P arranged in a matrix. The outline 114a of the thinning portion 114 has two side edges E1 and E2 opposite to each other and substantially parallel to the predetermined direction D1. The thinning portion 114 is defined by an area demarked by the outline 114a of the thinning portion 114 and the outline 112aA of the opening portion 112A. The thickness of the thinning portion 114 is thinner than the thickness of the peripheral area 120 (as shown in FIG. 3).

The difference from the mask 100 is that the outline 112aA of the opening portion 112A of the mask 100A is not internally tangent with the outline 114a of the thinning portion 114. In other words, the shortest distance between the outline 112aA of the opening portion 112A and the outline 114a of the thinning portion 114 can be greater than zero. To be more specific, the predetermined direction D1 is perpendicular to the direction D2, the shortest distance between the outline 112aA of the opening portion 112A and the outline 114a of the thinning portion 114 along the predetermined direction D1 is y, the shortest distance between the outline 112aA of the opening portion 112A and the outline 114a of the thinning portion 114 along the direction D2 is x, and the shortest distances x and y both are not equal to zero in the present embodiment. Accordingly, the opening portion 112A is separated from the peripheral area 120 by the thinning portion 114 and the patterned structures 110 are separated from each other by the peripheral area 120, wherein the "two components are separated" means that the two components are not right next to each other and an interposing component is located between the two components. In an embodiment, a radius of the circular shaped opening portion 112A is R, and R/y=Z, wherein 2≥Z≥0.2. In addition, a shortest distance from one opening portion 112A to a next opening portion 112A is DS, and DS>2×Z×R. In the present embodiment, the mask 100A can be used as an evaporation mask for fabricating an OLED device. By the configuration of shortest DS>2*20%*R, the mask wrinkles is farther from the opening portion 112A, which helps to reduce the color mixing defect when fabricating the OLED device and provide an enhanced yield rate. In one instance, the yield rate of fabricating an OLED device by using the mask during the evaporation process can be enhanced to 98% when Z is greater than 20%. However, the invention is not limited thereto, in other shown and not shown embodiments, the shortest distances x and y may be or may be not equal to zero.

At least one of the shortest distances x and y can be greater than zero. In other words, referring to FIG. 2 and FIG. 5, the proportion of the area occupied by the thinning portion 114 to the total area of the patterned structure 110 of the embodiment in FIG. 5 is greater than the proportion of the area occupied by the thinning portion 114 to the total area of the patterned structure 110 of the embodiment in FIG. 2. Therefore, the thinning portion 114 in FIG. 5 can further disperse the tensile stress, so as to further decrease the probability of generating wrinkles on the mask 100A and/or to further decrease the undulation degree of the wrinkles of the mask 100A compared to the thinning portion 114 in FIG. 2.

Figure 6:
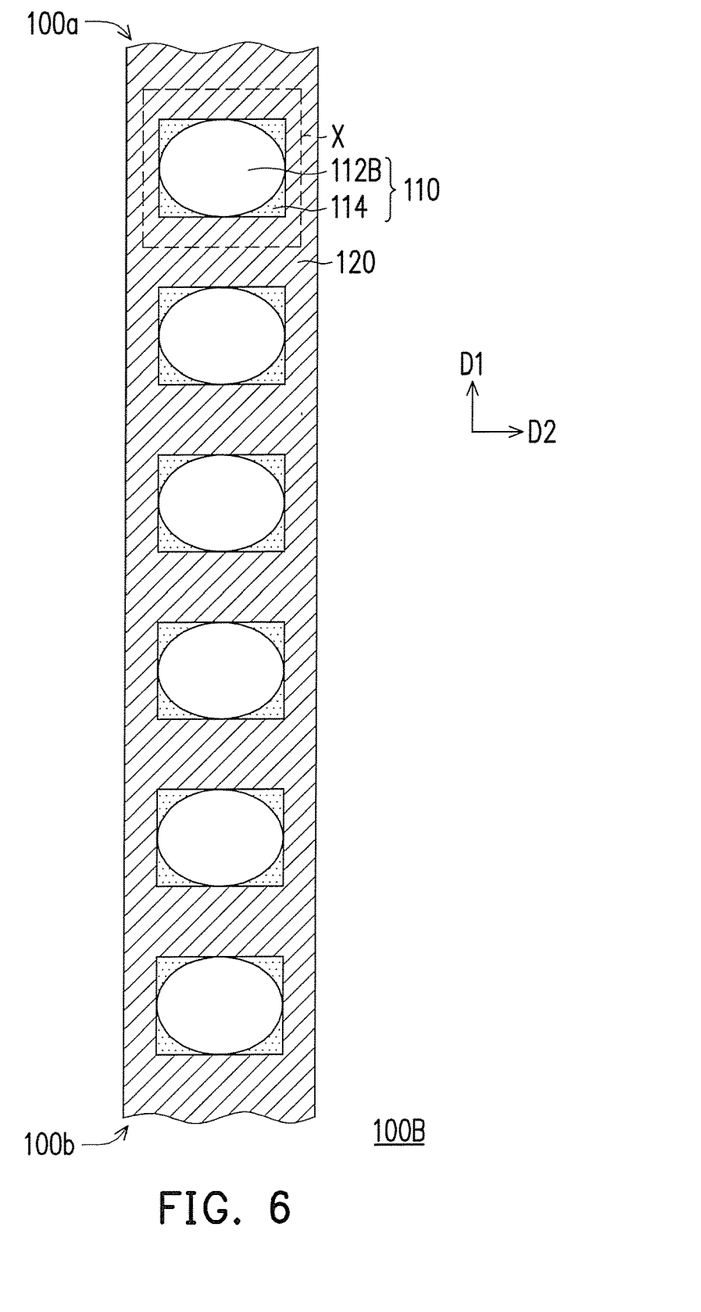
FIG. 6 is a schematic top view of a part of a mask according to another embodiment of the invention.
Figure 7:
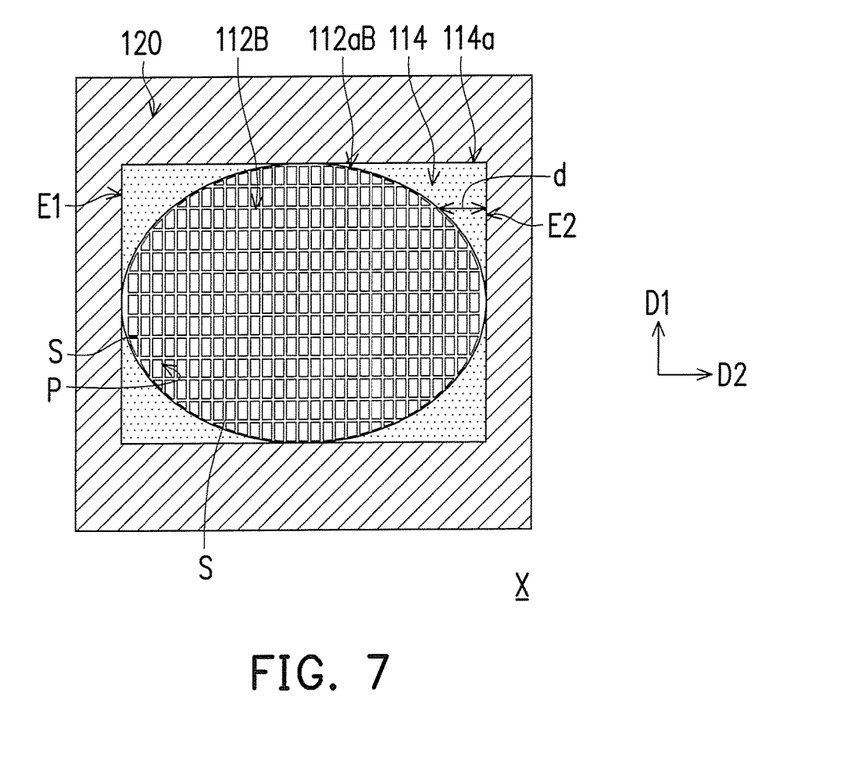
FIG. 7 is an enlarged schematic view of an area X of FIG. 6.

FIG. 6 is a schematic top view of a part of a mask of another embodiment of the invention. FIG. 7 is an enlarged schematic view of an area X of FIG. 6. Referring to FIG. 1, FIG. 2, FIG. 6, and FIG. 7, the mask 100B is similar to the mask 100, and thus the same or corresponding elements are represented by the same or corresponding reference labels. The difference between the mask 100B and the mask 100 is that the shape of the outline 112aB of the opening portion 112B of the mask 100B is different from the shape of the outline 112a of the opening portion 112 of the mask 100. The following descriptions mainly lies in this difference, and the descriptions of other elements in FIG. 6 and FIG. 7 with the same reference labels mentioned in the above are referred to the above embodiments and will not be repeated.

Referring to FIG. 6 and FIG. 7, the mask 100B includes a plurality of patterned structures 110 arranged sequentially along the predetermined direction D1 and the peripheral area 120 surrounding the patterned structures 110. Each of the patterned structures 110 includes the opening portion 112B and the thinning portion 114 surrounding the opening portion 112B. The opening portion 112B has the through holes P arranged in a matrix. The outline 114a of the thinning portion 114 has two side edges E1 and E2 opposite to each other and substantially parallel to the predetermined direction D1. The thinning portion 114 is defined by an area surrounded by the outline 114a of the thinning portion 114 and the outline 112aB of the opening portion 112B. The thickness of the thinning portion 114 is thinner than the thickness of the peripheral area 120 (as shown in FIG. 3).

The difference from the mask 100 is that the shape of the outline 112aB of the opening portion 112B of the mask 100B is not a circular shape but an elliptical shape. In the present embodiment, the four vertexes of the elliptical shape (the outline 112aB of the opening portion 112B) can all locate on the outline 114a of the thinning portion 114. However, the invention is not limited thereto. In another embodiment of the invention, the two vertexes of the long axis of the elliptical shape (the outline 112aB of the opening portion 112B) locate on the outline 114a of the thinning portion 114, the two vertexes of the short axis of the elliptical shape (the outline 112aB of the opening portion 112B) locate within the outline 114a of the thinning portion 114. Moreover, in another embodiment of the invention, the two vertexes of the short axis of the elliptical shape (the outline 112aB of the opening portion 112B) locate on the outline 114a of the thinning portion 114, the two endpoints of the long axis of the elliptical shape (the outline 112aB of the opening portion 112B) locate within the outline 114a of the thinning portion 114. The similar effects and advantages to the mask 100 of the mask 100B will not be repeated.

Figure 8:
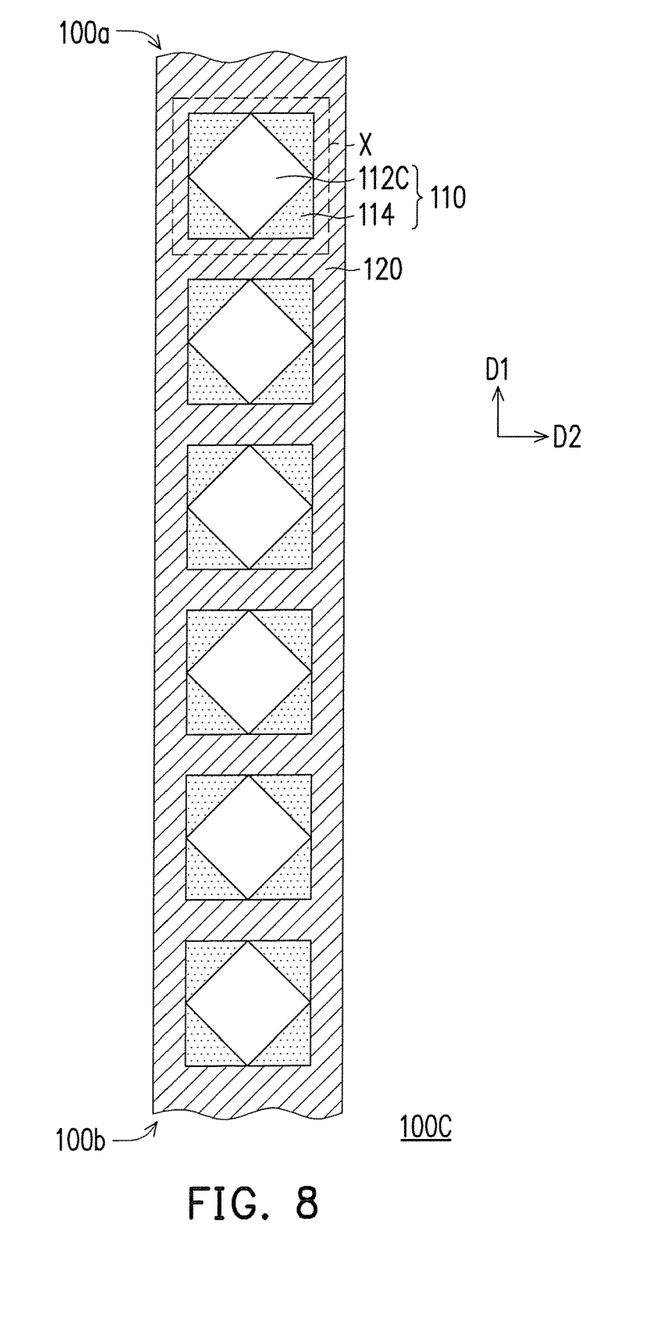
FIG. 8 is a schematic top view of a part of a mask according to another embodiment of the invention.
Figure 9:
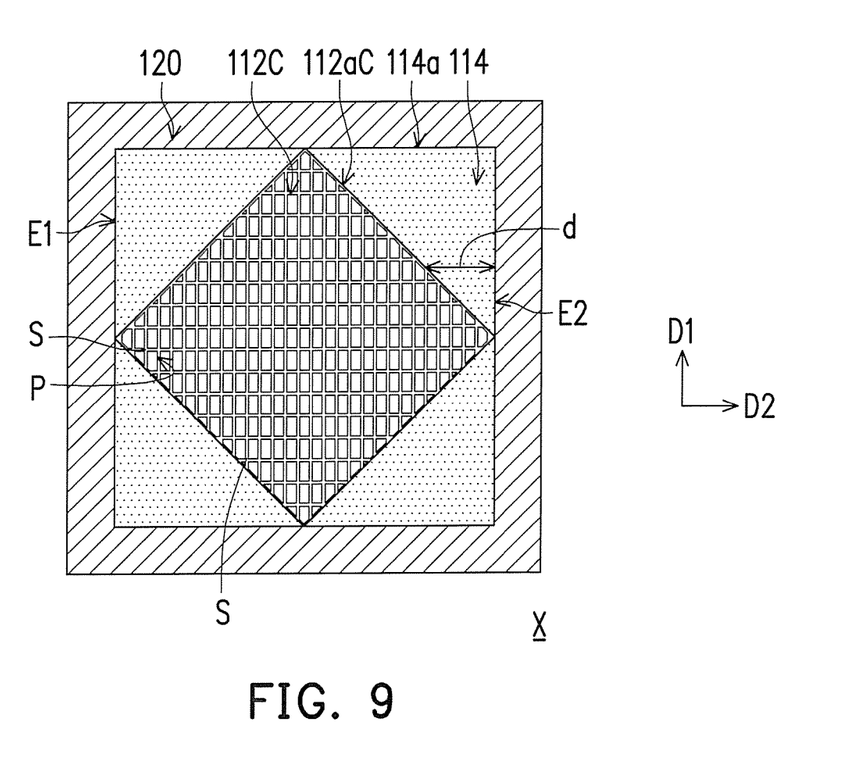
FIG. 9 is an enlarged schematic view of an area X of FIG. 8.

FIG. 8 is a schematic top view of a part of a mask of another embodiment of the invention. FIG. 9 is an enlarged schematic view of an area X of FIG. 8. Referring to FIG. 1, FIG. 2, FIG. 8, and FIG. 9, the mask 100C is similar to the mask 100, and thus the same or corresponding elements are represented by the same or corresponding reference labels. The difference between the mask 100C and the mask 100 is that the shape of the outline 112aC of the opening portion 112C of the mask 100C is different from the shape of the outline 112a of the opening portion 112 of the mask 100. The following descriptions mainly lies in this difference, and the descriptions of other elements in FIG. 8 and FIG. 9 with the same reference labels mentioned in the above are referred to the above embodiments and will not be repeated.

Referring to FIG. 8 and FIG. 9, the mask 100C includes a plurality of patterned structures 110 arranged sequentially along the predetermined direction D1 and the peripheral area 120 surrounding the patterned structures 110. Each of the patterned structures 110 includes the opening portion 112C and the thinning portion 114 surrounding the opening portion 112C. The opening portion 112C has the through holes P arranged in a matrix. The outline 114a of the thinning portion 114 has two side edges E1 and E2 opposite to each other and substantially parallel to the predetermined direction D1. The thinning portion 114 is defined by an area surrounded by the outline 114a of the thinning portion 114 and the outline 112aC of the opening portion 112C. The thickness of the thinning portion 114 is thinner than the thickness of the peripheral area 120 (as shown in FIG. 3).

The difference from the mask 100 is that the shape of the outline 112aC of the opening portion 112C of the mask 100C is not a circular shape but a rhombic shape. In the present embodiment, the four vertexes of the diamond shape (the outline 112aC of the opening portion 112C) can all locate on the outline 114a of the thinning portion 114. However, the invention is not limited thereto. In another embodiment of the invention, the two vertexes arranged along the predetermined direction D1 of the diamond shape (the outline 112aC of the opening portion 112C) locate on the outline 114a of the thinning portion 114, and the two vertexes arranged along the direction D2 of the diamond shape (the outline 112aC of the opening portion 112C) locate within the outline 114a of the thinning portion 114. Moreover, in another embodiment of the invention, the two vertexes arranged along the direction D2 of the diamond shape (the outline 112aC of the opening portion 112C) locate on the outline 114a of the thinning portion 114, and the two vertexes arranged along the predetermined direction D1 of the diamond shape (the outline 112aC of the opening portion 112C) locate within the outline 114a of the thinning portion 114. The similar effects and advantages to the mask 100 of the mask 100C will not be repeated.

Figure 10:
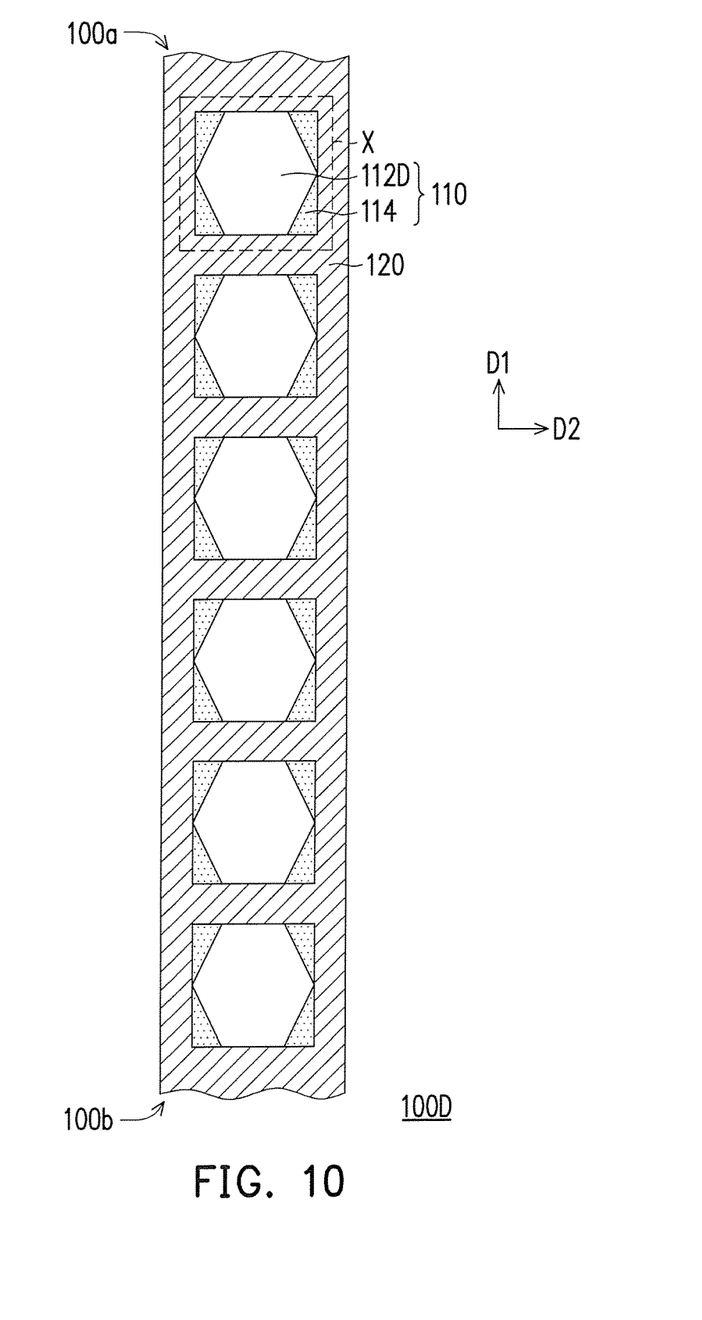
FIG. 10 is a schematic top view of a part of a mask according to one embodiment of the invention.
Figure 11:
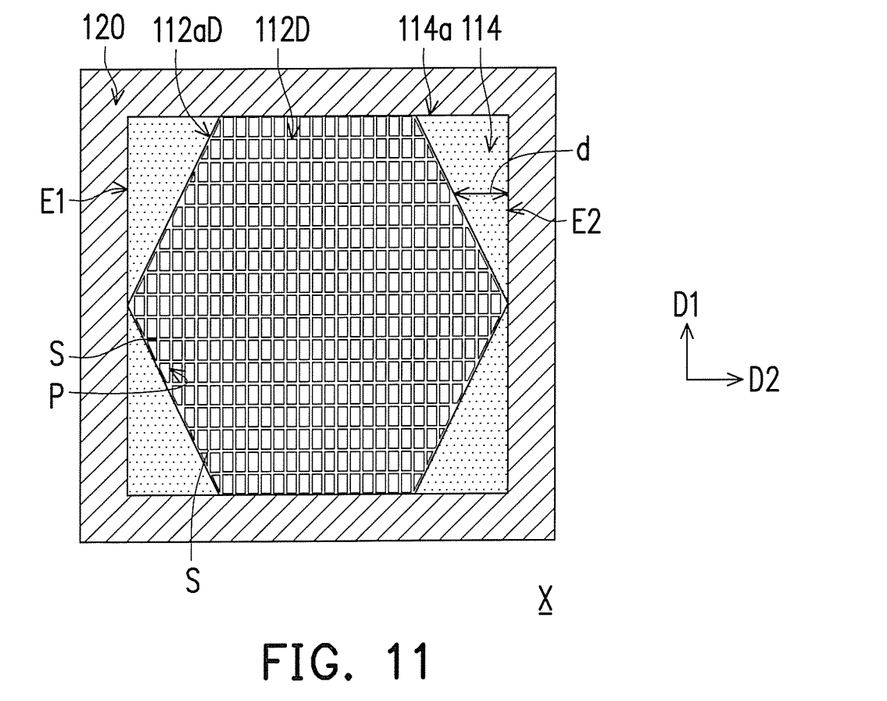
FIG. 11 is an enlarged schematic view of an area X of FIG. 10.

FIG. 10 is a schematic top view of a part of a mask of one embodiment of the invention. FIG. 11 is an enlarged schematic view of an area X of FIG. 10. Referring to FIG. 1, FIG. 2, FIG. 10, and FIG. 11, the mask 100D is similar to the mask 100, and thus the same or corresponding elements are represented by the same or corresponding reference labels. The difference between the mask 100D and the mask 100 is that the shape of the outline 112aD of the opening portion 112D of the mask 100D is different from the shape of the outline 112a of the opening portion 112 of the mask 100. The following descriptions mainly lies in this difference, and the descriptions of other elements in FIG. 8 and FIG. 9 with the same reference labels mentioned in the above are referred to the above embodiments and will not be repeated.

Referring to FIG. 10 and FIG. 11, the mask 100D includes a plurality of patterned structures 110 arranged sequentially along the predetermined direction D1 and the peripheral area 120 surrounding the patterned structures 110. Each of the patterned structures 110 includes the opening portion 112D and the thinning portion 114 surrounding the opening portion 112D. The opening portion 112D has the through holes P arranged in a matrix. The outline 114a of the thinning portion 114 has two side edges E1 and E2 opposite to each other and substantially parallel to the predetermined direction D1 The thinning portion 114 is defined by an area surrounded by the outline 114a of the thinning portion 114 and the outline 112aD of the opening portion 112D. The thickness of the thinning portion 114 is thinner than the thickness of the peripheral area 120 (as shown in FIG. 3).

The difference from the mask 100 is that the shape of the outline 112aD of the opening portion 112D of the mask 100D is not a circular shape but a hexagonal shape. In the present embodiment, the two, top and bottom, edges and the two, left and right, vertexes of the hexagonal shape (the outline 112aD of the opening portion 112D) can all locate on the outline 114a of the thinning portion 114. However, the invention is not limited thereto. In another embodiment of the invention, the two, top and bottom, edges arranged along the predetermined direction D1 of the hexagonal shape (the outline 112aD of the opening portion 112D) locate on the outline 114a of the thinning portion 114, and the two, left and right, vertexes arranged along the direction D2 of the hexagonal shape (the outline 112aD of the opening portion 112D) locate within the outline 114a of the thinning portion 114. Moreover, in another embodiment of the invention, the two, top and bottom, edges arranged along the predetermined direction D1 of the hexagonal shape (the outline 112aD of the opening portion 112D) locate within the outline 114a of the thinning portion 114, and the two, left and right, vertexes arranged along the direction D2 of the hexagonal shape (the outline 112aD of the opening portion 112D) locate on the outline 114a of the thinning portion 114. The similar effects and advantages to the mask 100 of the mask 100D will not be repeated.

Figure 12:
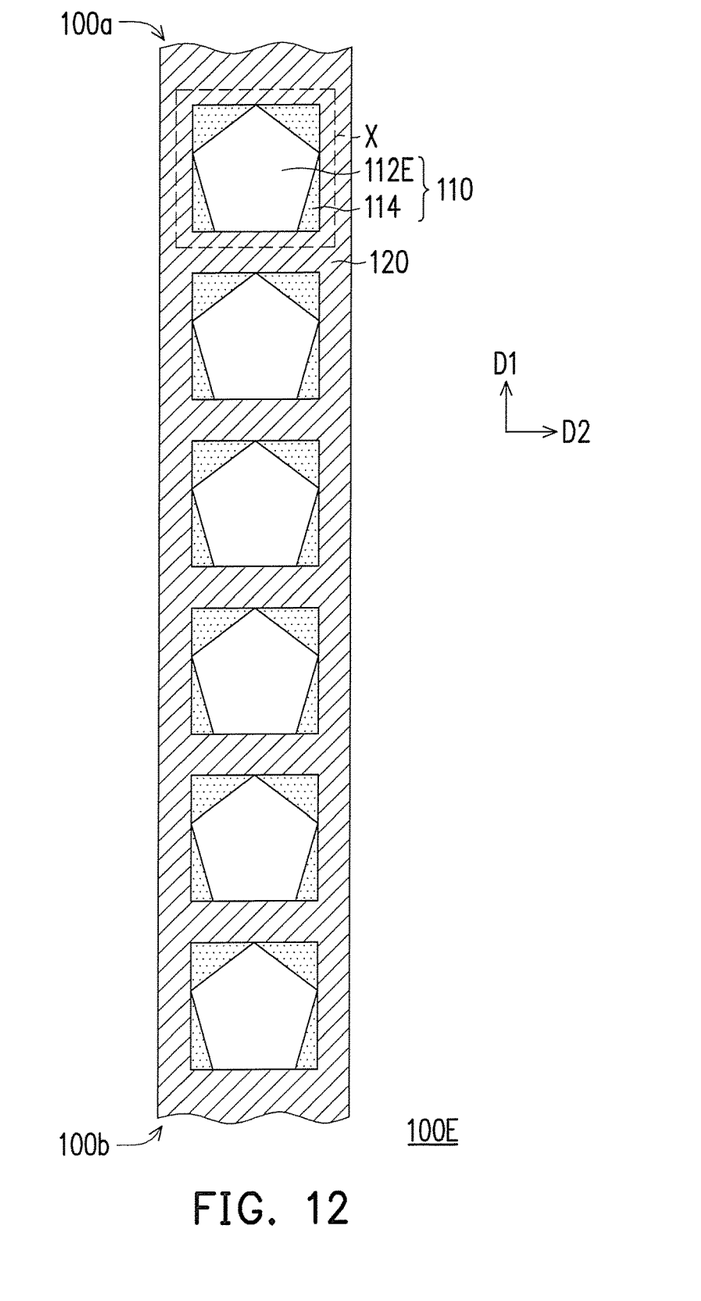
FIG. 12 is a schematic top view of a part of a mask according to another embodiment of the invention.
Figure 13:
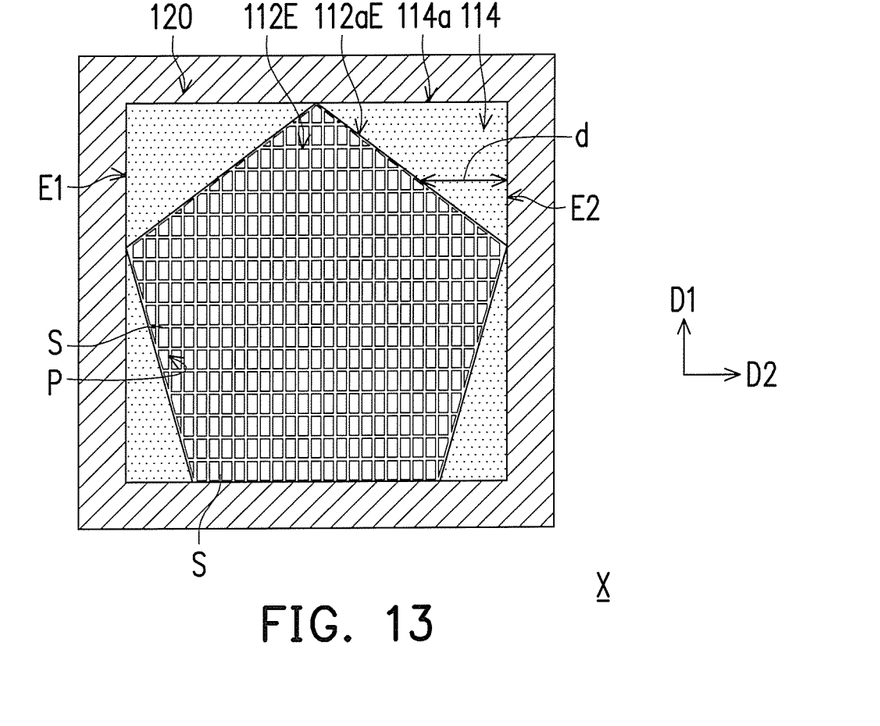
FIG. 13 is an enlarged schematic view of an area X of FIG. 12.

FIG. 12 is a schematic top view of a part of a mask of another embodiment of the invention. FIG. 13 is an enlarged schematic view of an area X of FIG. 12. Referring to FIG. 1, FIG. 2, FIG. 12, and FIG. 13, the mask 100E is similar to the mask 100, and thus the same or corresponding elements are represented by the same or corresponding reference labels. The difference between the mask 100E and the mask 100 is that the shape of the outline 112aE of the opening portion 112E of the mask 100E is different from the shape of the outline 112a of the opening portion 112 of the mask 100. The following descriptions mainly lies in this difference, and the descriptions of other elements in FIG. 12 and FIG. 13 with the same reference labels mentioned in the above are referred to the above embodiments and will not be repeated.

Referring to FIG. 12 and FIG. 13, the mask 100E includes a plurality of patterned structures 110 arranged sequentially along the predetermined direction D1 and the peripheral area 120 surrounding the patterned structures 110. Each of the patterned structures 110 includes the opening portion 112E and the thinning portion 114 surrounding the opening portion 112E. The opening portion 112E has the through holes P arranged in a matrix. The outline 114a of the thinning portion 114 has two side edges E1 and E2 opposite to each other and substantially parallel to the predetermined direction D1. The thinning portion 114 is defined by an area surrounded by the outline 114a of the thinning portion 114 and the outline 112aE of the opening portion 112E. The thickness of the thinning portion 114 is thinner than the thickness of the peripheral area 120 (as shown in FIG. 3).

The difference from the mask 100 is that the shape of the outline 112aE of the opening portion 112E of the mask 100E is not a circular shape but a pentagonal shape. In the present embodiment, the top vertex, the bottom edge corresponding to the top vertex, and the two, left and right, vertexes of the pentagonal shape (the outline 112aE of the opening portion 112E) can all locate on the outline 114a of the thinning portion 114. However, the invention is not limited thereto. In another embodiment of the invention, the top vertex and the bottom edge corresponding to the top vertex arranged along the predetermined direction D1 of the pentagonal shape (the outline 112aE of the opening portion 112E) locate on the outline 114a of the thinning portion 114, and the two, left and right, vertexes arranged along the direction D2 of the pentagonal shape (the outline 112aE of the opening portion 112E) locate within the outline 114a of the thinning portion 114. Moreover, in another embodiment of the invention, the top vertex and the bottom edge corresponding to the top vertex arranged along the predetermined direction D1 of the pentagonal shape (the outline 112aE of the opening portion 112E) locate within the outline 114a of the thinning portion 114, and the two, left and right, vertexes arranged along the direction D2 of the pentagonal shape (the outline 112aE of the opening portion 112E) locate on the outline 114a of the thinning portion 114. The similar effects and advantages to the mask 100 of the mask 100E will not be repeated.

In summary, the mask of the embodiments of the invention has a plurality of patterned structures, and each patterned structure has the opening portion and the thinning portion configured inside-out. The thickness of the thinning portion is configured to buffer and to disperse the tensile stress, so as to mitigate the phenomenon of generating wrinkles when the mask is extended by external forces.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:
1. A mask, comprising:
a plurality of patterned structures, arranged sequentially along a predetermined direction, wherein each of the plurality of patterned structures comprises:

an opening portion, having a plurality of through holes arranged in a matrix; and a thinning portion, surrounding the opening portion, wherein an outer outline of the thinning portion has two side edges opposite to each other, the two side edges are parallel to the predetermined direction, and the thinning portion is defined by an area demarked by the outer outline of the thinning portion and an outer outline of the opening portion, wherein the outer outline of the opening portion forms a non-rectangular shape, the outer outline of the thinning portion forms a rectangular shape and the opening portion is located within the area demarked by the outer outline of the thinning portion forming the rectangular shape; and a peripheral area, surrounding the plurality of patterned structures, wherein a thickness of the thinning portion is thinner than a thickness of the peripheral area.

2. The mask as recited in claim 1, wherein the thickness of the thinning portion is in range of 35% to 75% of the thickness of the peripheral area.

3. The mask as recited in claim 1, wherein the mask is shaped in a long strip, and an extending direction of the long strip is parallel to the predetermined direction.

4. The mask as recited in claim 1, wherein a distance between the outer outline of the opening portion and the outer outline of the thinning portion decreases gradually at first and then increases gradually along the predetermined direction.

5. The mask as recited in claim 1, wherein the opening portion comprises a plurality of line sections, the line sections are connected to form a grid and define the plurality of through holes.

6. The mask as recited in claim 5, wherein a thickness of the line sections is thicker than the thickness of the thinning portion.

7. The mask as recited in claim 5, wherein the thickness of the line sections is equal to the thickness of the peripheral area.

8. The mask as recited in claim 1, wherein the plurality of patterned structures and the peripheral area are formed by a same patterned sheet.

9. The mask as recited in claim 1, wherein the opening portion of each of the plurality of patterned structures forms a circular shape, a shortest distance between the outer outline of the opening portion and the outer outline of the thinning portion along the predetermined direction is y, a radius of the circular shape is R, and R/y=Z, wherein $2 \geq Z \geq 0.2$.

10. The mask as recited in claim 9, wherein a shortest distance from one opening portion of one of the plurality of patterned structures to a next opening portion of another one of the plurality of patterned structures is DS, and $DS > 2 \times Z \times R$.

* * * * *